(12) United States Patent
Jung

(10) Patent No.: US 6,343,048 B1
(45) Date of Patent: Jan. 29, 2002

(54) OPERATION MODE SETTING CIRCUIT OF SEMICONDUCTOR MEMORY DEVICE AND METHOD FOR SETTING THEREOF

(75) Inventor: Woo Seop Jung, Kyungki-do (KR)

(73) Assignee: Samsung Electronic Co., Ltd., Suwon (KR)

( * ) Notice: Subject to any disclaimer, the term of this patent is extended or adjusted under 35 U.S.C. 154(b) by 0 days.

(21) Appl. No.: 09/710,221

(22) Filed: Nov. 10, 2000

(30) Foreign Application Priority Data

Nov. 18, 1999 (KR) .......................................... 99-51338

(51) Int. Cl.$^7$ ................................................ G11C 8/00
(52) U.S. Cl. ................... 365/233; 365/201; 365/189.07
(58) Field of Search ................................ 365/233, 201, 365/230.06, 189.07

(56) References Cited

U.S. PATENT DOCUMENTS 6,031,786 A * 2/2000 Jang et al. .................. 365/233

* cited by examiner

Primary Examiner—Huan Hoang
(74) Attorney, Agent, or Firm—Marger Johnson & McCollom, P.C.

(57) ABSTRACT

The present invention relates to an operation mode setting circuit and a method for setting thereof. The circuit includes a mode register, an internal control signal generator, a mode control signal generator, a first output unit, a second output unit, a first decoder and a second decoder. The mode register provides internal address signals by inputting external address signals. The internal control signal generator generates an internal control signal in response to an external control signal. The mode control signal generator generates a test mode control signal or mode register set control signal by combining the internal address signals in response to a mode register set write signal and the internal control signal. The first output unit outputs a corresponding address signal among the internal address signals as a first internal address signal in response to the mode register set control signal. The second output unit outputs a corresponding address signal among the internal address signals as a second internal address signal in response to the test mode control signal. The first decoder generates a setting signal of a programmed operation mode by decoding the first internal address signal output from the first output unit. The second decoder generates a setting signal of a programmed test mode by decoding the signal output from the second output unit. Thus, the possibility that a test mode is inadvertently set in a user mode is prevented by blocking a test mode control signal output by the internal control signal.

12 Claims, 7 Drawing Sheets

OPERATION MODE SETTING CIRCUIT OF SEMICONDUCTOR MEMORY DEVICE AND METHOD FOR SETTING THEREOF

This application claims priority from Korean Priority Document No. 1999-51338, filed on Nov. 18, 1999 with the Korean Industrial Property Office, which document is hereby incorporated by reference.

BACKGROUND OF THE INVENTION

1. Field of the Invention

The present invention relates to an operation mode circuit of a semiconductor memory device, and a method for setting thereof. More particularly, the invention relates to an operation mode setting circuit which can prevent a malfunction in a user mode of a mode register set circuit of a semiconductor memory device, which can previously program an operation of a Synchronous DRAM such as SDRAM.

2. Description of the Related Arts

Generally, a Sync DRAM or Rambus DRAM can set row access time, column access time or burst length as positive number times, have a register determine a bandwidth, and test an operation mode of a circuit according to programs of the register. The register is referred to as a mode register, and the circuit is referred to as a mode register set (MRS) circuit.

FIG. 1 is a block diagram showing an operation mode setting circuit of a conventional semiconductor memory device. FIG. 2 is a circuit diagram showing a mode control signal generator. And FIG. 3 is a timing diagram for explaining the operation of the circuit of FIG. 1.

Conventionally, external address signals A0~A11 are latched to a mode register 10. The latched internal address signals IA0~IA11 are provided to a mode control signal generator 12 and an output unit 14. As shown in FIG. 2, the mode control signal generator 12 makes a combination of address signals IAl and IAm associated with a test mode, and address signals IAi~IAk associated with a MRS among the inputted internal address signals. The mode control signal generator 12 then judges a present operation mode to be either a test mode or user mode, and then outputs a corresponding mode control signal MRSET or TMSET. In this case, these mode control signals are enabled in response to a Pulsed Write Command signal PWCBR of the MRS.

The output unit 14 selectively outputs address signals associated with each mode in response to the mode control signal (MRSET or TMSET), and provides to a first decoder 16 or a second decoder 18, depending on whether the mode is regular or test. The first or second decoder 16 or 18 decodes the provided address signals, and then outputs programmed operation mode signals MRSi and TESi, to set an operation mode of a chip.

The test mode is a mode used by the semiconductor chip manufacturer during manufacturing, to test whether the chip is defective. The test mode, however, is meaningless to the eventual customer, who is also considered to be a general user.

A problem arises since general users often program MRS values in a user mode. When they make a mistake, an invalid MRS value or test mode value is often programmed.

Accordingly, as disclosed in the Korean Patent Publication No. 1999-3104, if an invalid MRS is set in a user mode, the invalid MRS is changed to a valid MRS thereafter, and then the valid MRS is reset in a user mode. In other words, in case a test mode is set in a user mode by mistake, if a user mode is reset, a test mode and a user mode are set in the same time. As a result, the chip makes an error, since the chip recognizes that a user mode is not set. Therefore, the publication discloses technology for resetting a test mode, in case of resetting a user mode after a test mode is set.

However, strictly speaking, the above mentioned publication is not to reset a test operation in the state that a chip is operating in a test mode, but to reset a test mode setting signal. Therefore, it requires much time, from after the test mode setting signal is reset until a test operation is completely reset in response to the reset operation.

That is, it is inconvenient to reset a normal operation after waiting until an entering operation is completely reset, and then repaired to a normal status.

SUMMARY OF INVENTION

To solve the problem of the prior art described above, an object of the present invention is to provide an operation mode setting circuit of a semiconductor memory device and a method for setting thereof, which can prevent a test mode from being set in a user mode. The invention blocks a test mode, even in case a user sets a test mode in a user mode by mistake. This improves the convenience of users.

The invention blocks the test mode by assuring that the test mode control signal is controlled also by an additional external signal. Preferably, the external control signal is a clock enable signal or data input/output control signal. The test mode is blocked in an active area of the clock enable signal. In the preferred embodiment only, an internal control signal is generated from the external control signal.

A circuit of the present invention includes a mode register, an internal control signal generator to generate the internal control signal, a mode control signal generator, an output unit, a first decoder and a second decoder.

A method according to the present invention includes generating internal address signals by inputting external address signals into a mode register. The method also includes generating a test mode control signal or mode register set control signal by combining the internal address signals in response to a mode register set write signal and also to an external control signal. The method additionally includes outputting a corresponding address signal among the internal address signals as a first internal address signal in response to the mode register set control signal, or outputting a corresponding address signal among the internal address signals as a second internal address signal in response to the test mode control signal.

BRIEF DESCRIPTION OF THE ATTACHED DRAWINGS

DETAILED DESCRIPTION OF THE INVENTION

Figure 4:
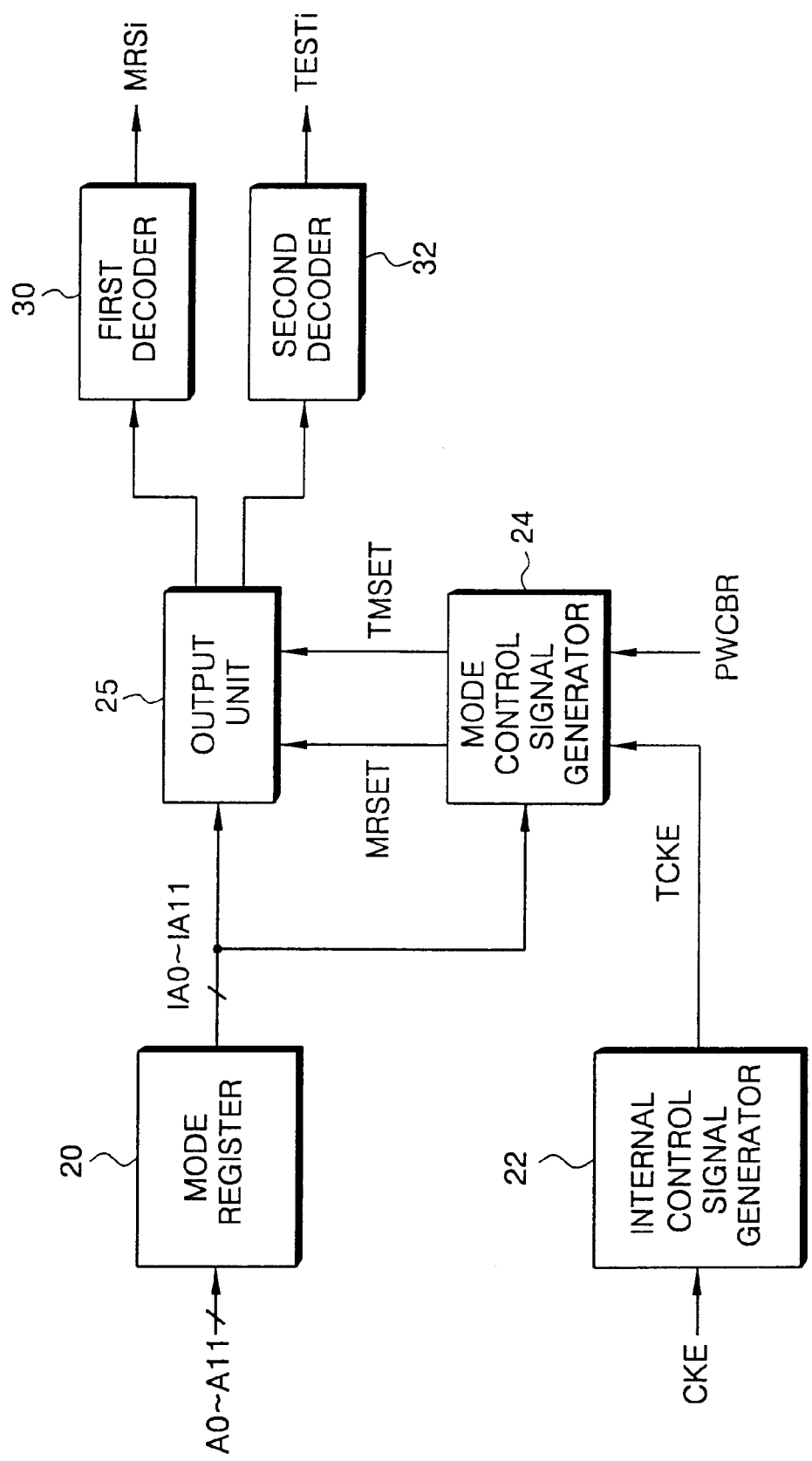
FIG. 4 is a block diagram showing an operation mode setting circuit of a semiconductor memory device made according to an embodiment of the present invention.

In FIG. 4, a circuit includes a mode register 20, an internal control signal generator 22, a mode control signal generator 24, an output unit 25, a first decoder 30 and a second decoder 32.

The mode register 20 provides internal address signals IA0~IA11 by inputting external address signals A0~A11. When a clock enable signal CKE is at a high level in an active mode, if an external chip select signal /CS, an external row address strobe signal /RAS, an external column address strobe signal /CAS and an external write enable signal /WE is at a low level, the address input signals A0~A10 and A11 are written into the mode register 20.

In the case of a 16M SDRAM, 12-bit data are stored into the mode register 20. Of the three, A0~A2 denote burst length fields, A3 denotes a burst type, and A4~A6 denote CAS latency fields. A7~A11, except for A9, are fields used by a chip manufacturer for test and special purposes, which are always set as "0" in a normal operation. Mainly, A7 and A8 are used as test mode fields. A9 is a Burst Read Single Write (BRSW), which is mainly used in graphic appliances.

Figure 5:
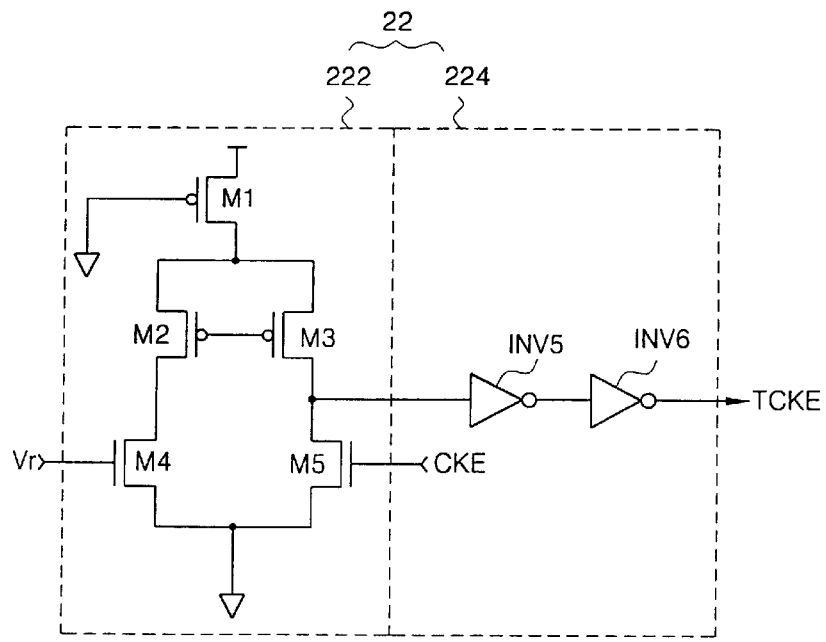
FIG. 5 is a circuit diagram illustrating a preferred embodiment of an internal control signal generator of the circuit shown in FIG. 4.

FIG. 5 is a circuit diagram illustrating a preferred embodiment of the internal control signal generator 22 shown in FIG. 4. Generator 22 comprises a comparator 222 and an output buffer 224. The comparator 222 includes a differential amplifier having mode transistors M1~M5. The output buffer 224 includes inverters INV5 and INV6 connected to each other in series.

A reference signal Vr is input through one input end of the differential amplifier, and the clock enable signal CKE is input through the other input end of the differential amplifier. The reference signal Vr is kept at an intermediate value. Accordingly, while the clock enable signal CKE is kept at a high level, i.e., in an active area, the comparator 222 outputs a signal of a low level. That is, an internal control signal TCKE is output through the output buffer 224, having an opposite phase with respect to the clock enable signal CKE.

Figure 6:
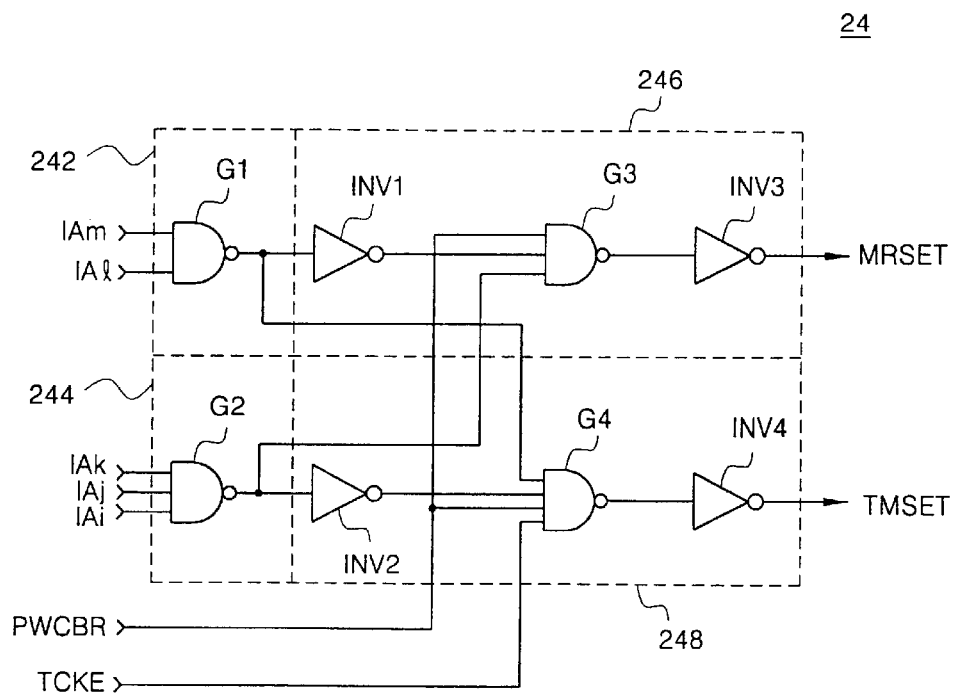
FIG. 6 is a circuit diagram illustrating a preferred embodiment of a mode control signal generator of the circuit shown in FIG. 4.

FIG. 6 is a circuit diagram illustrating a preferred embodiment of the mode control signal generator 24 shown in FIG. 4. The mode control signal generator 24 includes a first detector 242, a second detector 244, a first signal generator 246 and a second signal generator 248.

The first detector 242, comprising a NAND gate G1, outputs non-active data of a test mode as a first detecting signal, when test mode address signals Al and Am are input and both signals are at a high level. That is, in case two signals Al, Am are '0,0', '0,1' or '1,0', a test mode is operated. In case two signals Al and Am are '1,1', a test mode is not operated.

The second detector 244, comprising a NAND gate G2, outputs non-active data of a mode register set as a second detecting signal when mode register set address signals Ai, Aj and Ak are input, and all three signals are at a high level. That is, in case just one of the three address signals Ai, Aj and Ak includes a '0', a MRS mode or user mode is operated. In case the three signals are '1,1,1', a MRS mode is not operated. Wherein, non-active data is detected when address signals determining column address strobe latency are all at a high level. The first signal generator 246 comprises an inverter INV1, a NAND gate G3 and an inverter INV3. The first signal generator 246 makes a combination of the first detecting signal inverted by the inverter INV1, the second detecting signal from G2, and a MRS write command signal PWCBR through the NAND gate G3. Generator 246 then generates a MRS control signal MRSET by inverting the result by means of the inverter INV3. That is, when Al and Am are '1,1' and at least one of Ai, Aj and Ak is '0', the MRSET signal goes to an active state, because of the PWCBR pulse signal. The second signal generator 248 comprises an inverter INV2, a NAND gate G4 and an inverter INV4. The second signal generator 248 makes a combination of the second detecting signal inverted by the inverter INV2, the first detecting signal from G1, the MRS write command signal PWCBR, and also the internal control signal TCKE through the NAND gate G4. Generator 248 then generates a test mode control signal TMSET by inverting the result by means of the inverter INV4. That is, when at least one of Al and Am is '0', Ai, Aj and Ak are '1,1,1', the signal TCKE is at a high level, the signal TMSET goes to an active state, because of the PWCBR pulse signal.

Figure 1:
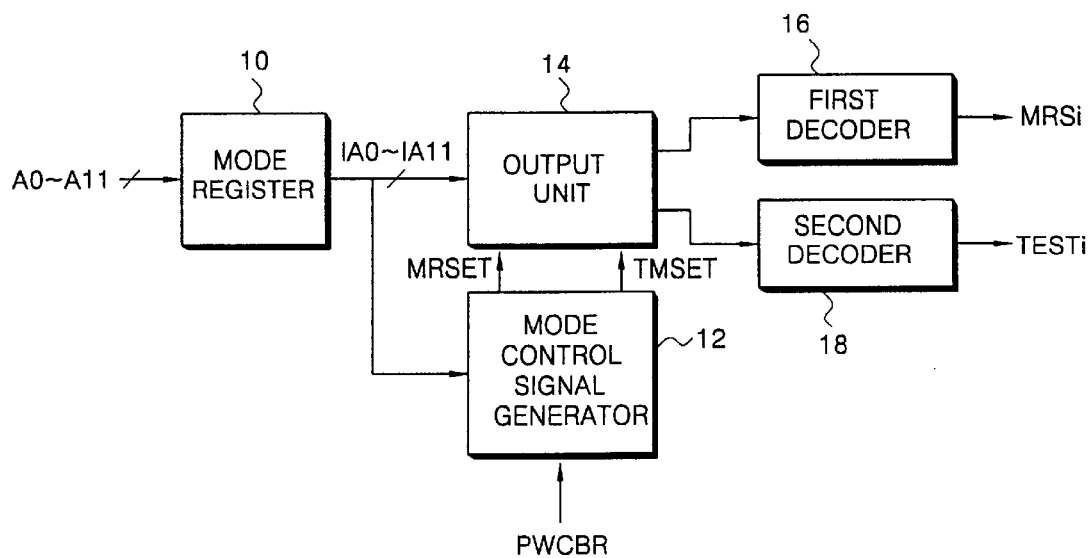
FIG. 1 is a block diagram showing an operation mode setting circuit of a prior art semiconductor memory device.
Figure 2:
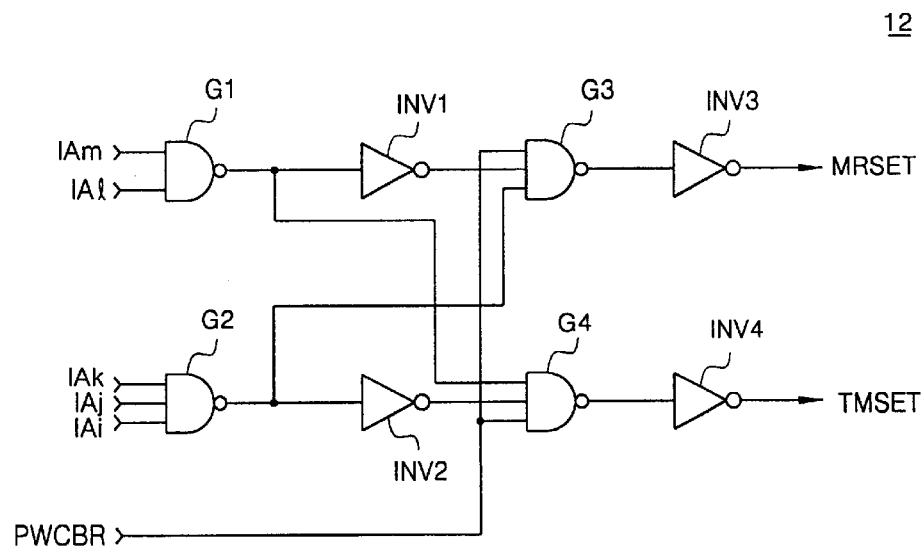
FIG. 2 is a circuit diagram illustrating a mode control signal generator of the circuit shown in FIG. 1.
Figure 3:
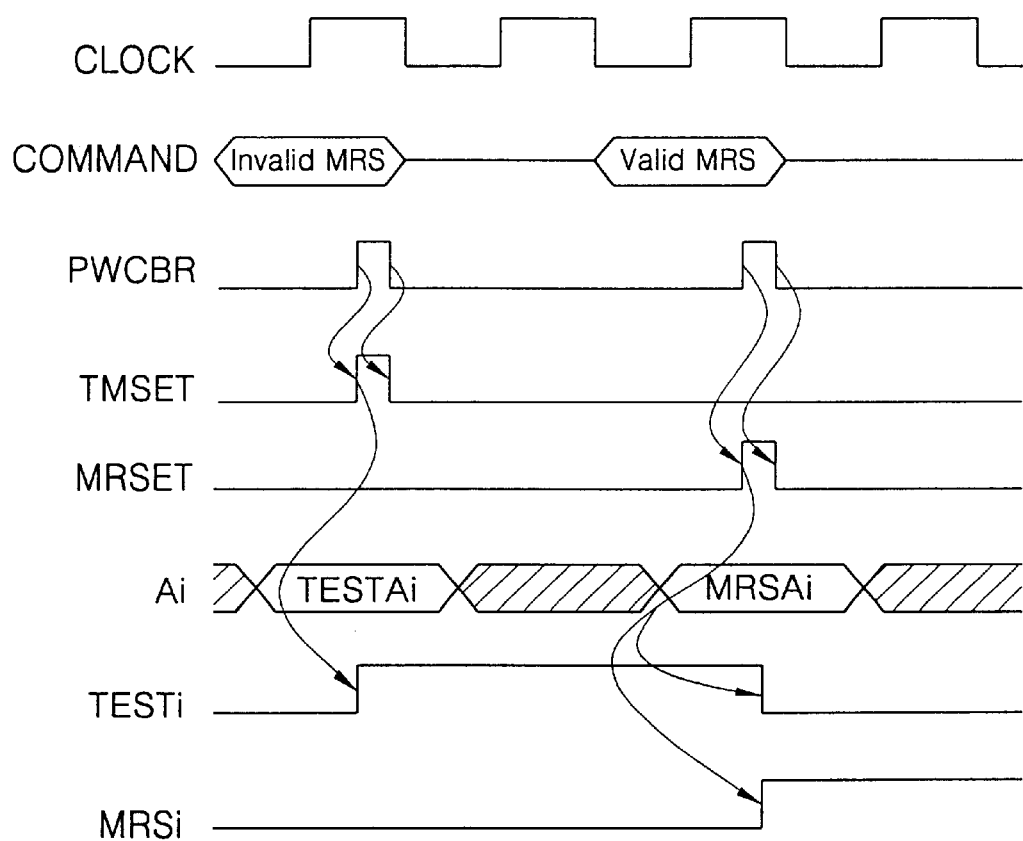
FIG. 3 is a timing diagram for explaining an operation of the circuit shown in FIG. 1.
Figure 7:
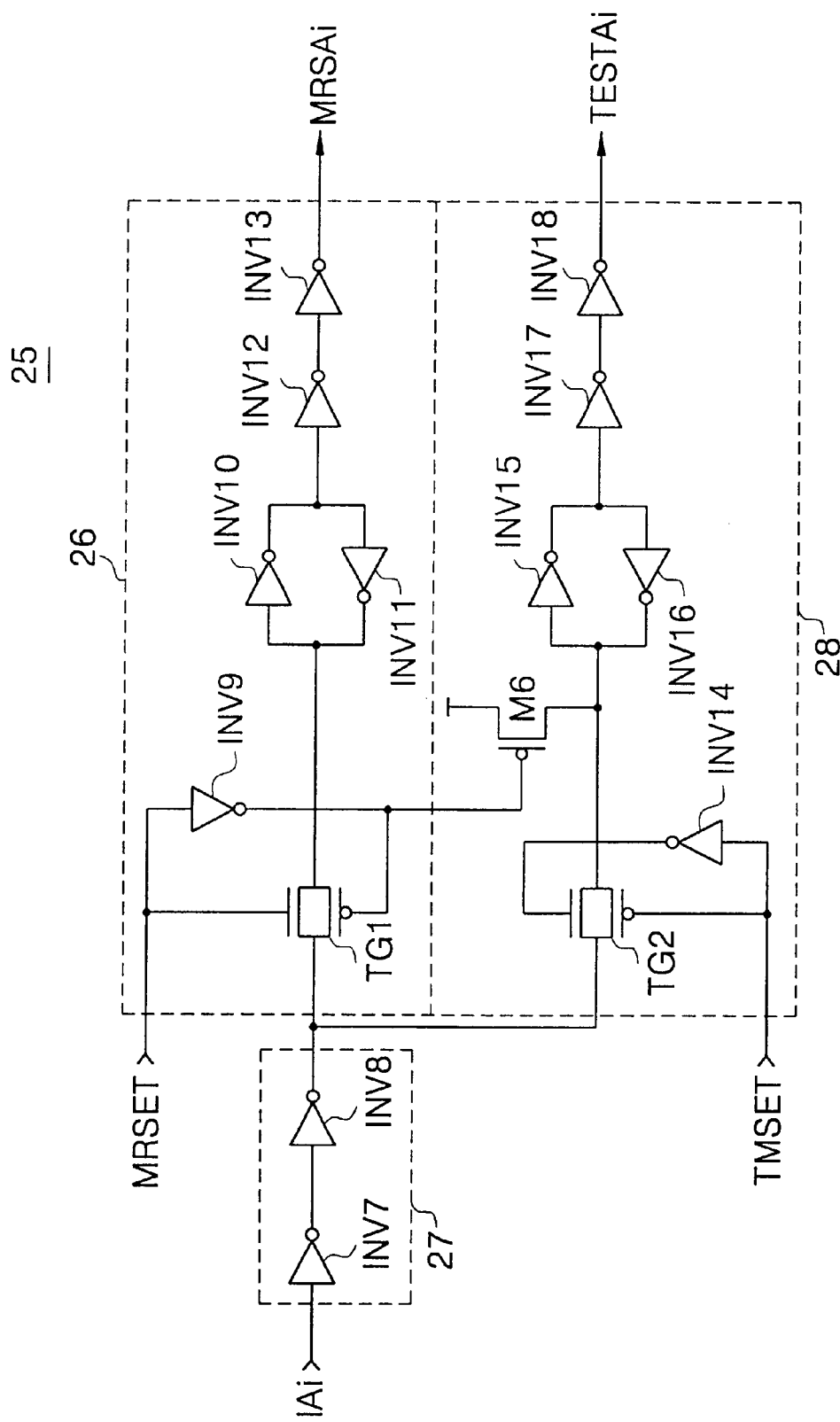
FIG. 7 is a circuit diagram illustrating a preferred embodiment of a first and second output units of the circuit shown in FIG. 4.

An important advance of the present invention over the prior art is seen by contrasting circuit 24 of FIG. 7 with circuit 12 of FIG. 2. While many components appear similar, there are critical differences. In circuit 24, NAND gate G4 is a four input gate, not a three input gate. The additional input receives external signal TCKE, unlike that of the prior art. As such, the signal TMSET of the invention in FIG. 6 and FIG. 4 is different from that of the prior art in FIGS. 1–3.

While signal TCKE is used in this embodiment (formed by signal CKE), that is not limiting. Indeed, the other signals can be used, with appropriate adjustments for generating signal TMSET, as will be apparent to a person skilled in the art in view of this description. For example, a data input/output control signal DQM, or an external control signal provided by different external input pin, can be substituted for the clock enable signal CKE.

FIG. 7 is a circuit diagram illustrating a preferred embodiment of the output unit 25 shown in FIG. 4. The output unit 25 inputs the internal address signals IA0~A11 through an input buffer 27. The input buffer 27 includes inverters INV7 and INV8 connected to each other in series.

The output unit 25 also includes a first individual output unit 26, and a second individual output unit 28. Then the individual output units 26, 28 output a MRS address signal MRSAi, and a test mode address signal TESTAi by each bit. Accordingly, a 16 Mb SDRAM comprises 12 circuits, because each bit of a MRS address signal comprises a circuit shown in FIG. 7.

The first individual output unit 26 includes a transfer gate TG1 and inverters INV9~INV13. The transfer gate TG1 latches an address signal input by responding to a latch comprising inverters INV15 and INV16. The latched signal is output as the second internal address signal TESTAi through a buffer comprising inverters INV17 and INV18 of the second individual output unit 28. Unit 28 also includes a transfer gate TG2 and inverters INV14–INV18. A mode transistor M6 resets an invalid MRS in response to a MRSET generated in a valid MRS.

The first decoder 30 inputs and decodes the signal MRSAi, and then generates a signal MRSi according to the result of decoding. For example, in 16 Mb SDRAM, the first decoder 30 generates 8 burst length modes, 2 burst types, and 5 CAS modes.

The second decoder 32 inputs and decodes the signal TESTAi, and then generates a signal TESTi according to the result of decoding. For example, three test modes 00, 01, and 10 are generated.

An operation of the circuit according to the present invention will be explained below with reference to FIG. 8 and FIG. 9. These figures show wave forms of signals, discussed so far, and are to be contrasted with wave forms of the same signals for the prior art circuit of FIG. 3.

Figure 8:
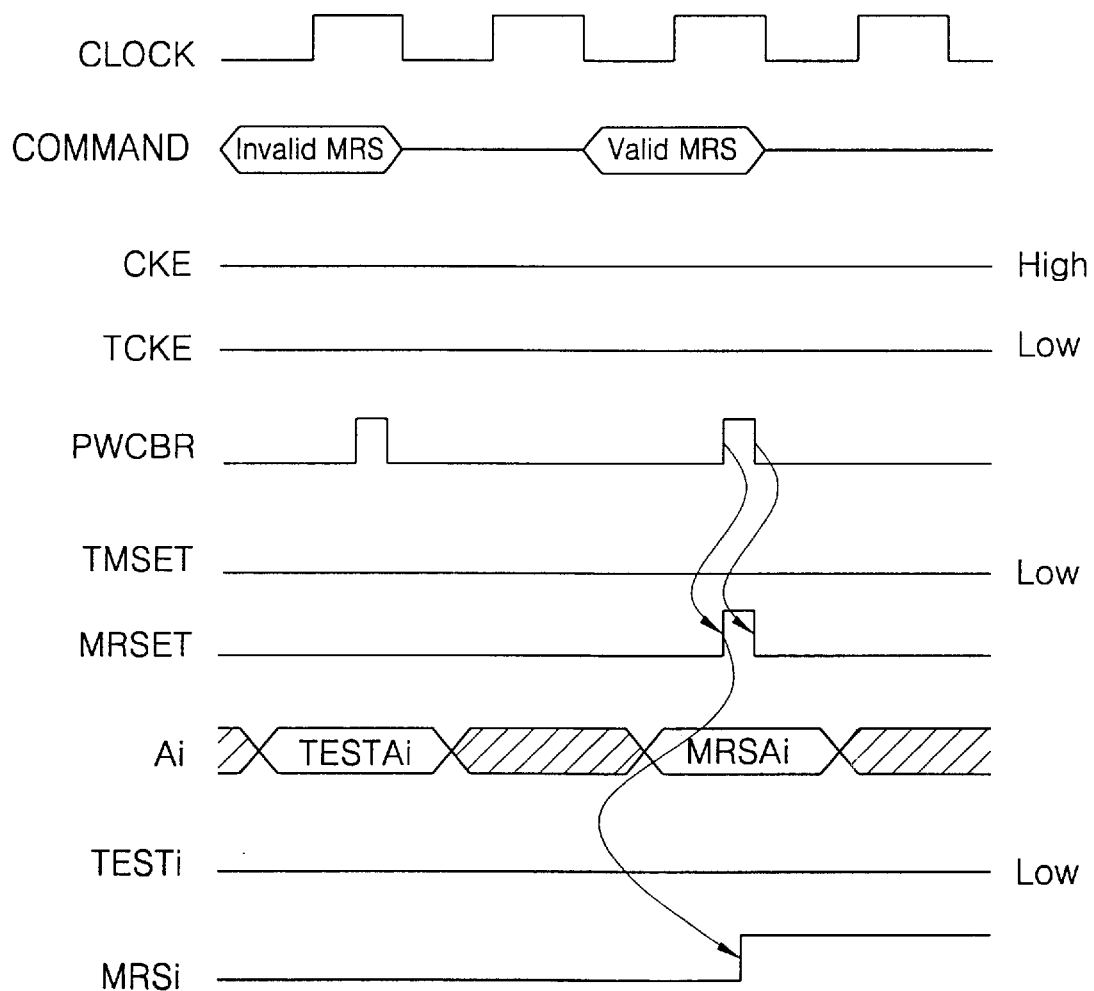
FIG. 8 is a timing diagram for explaining an operation of the circuit shown in FIG. 4 in a user mode.
Figure 9:
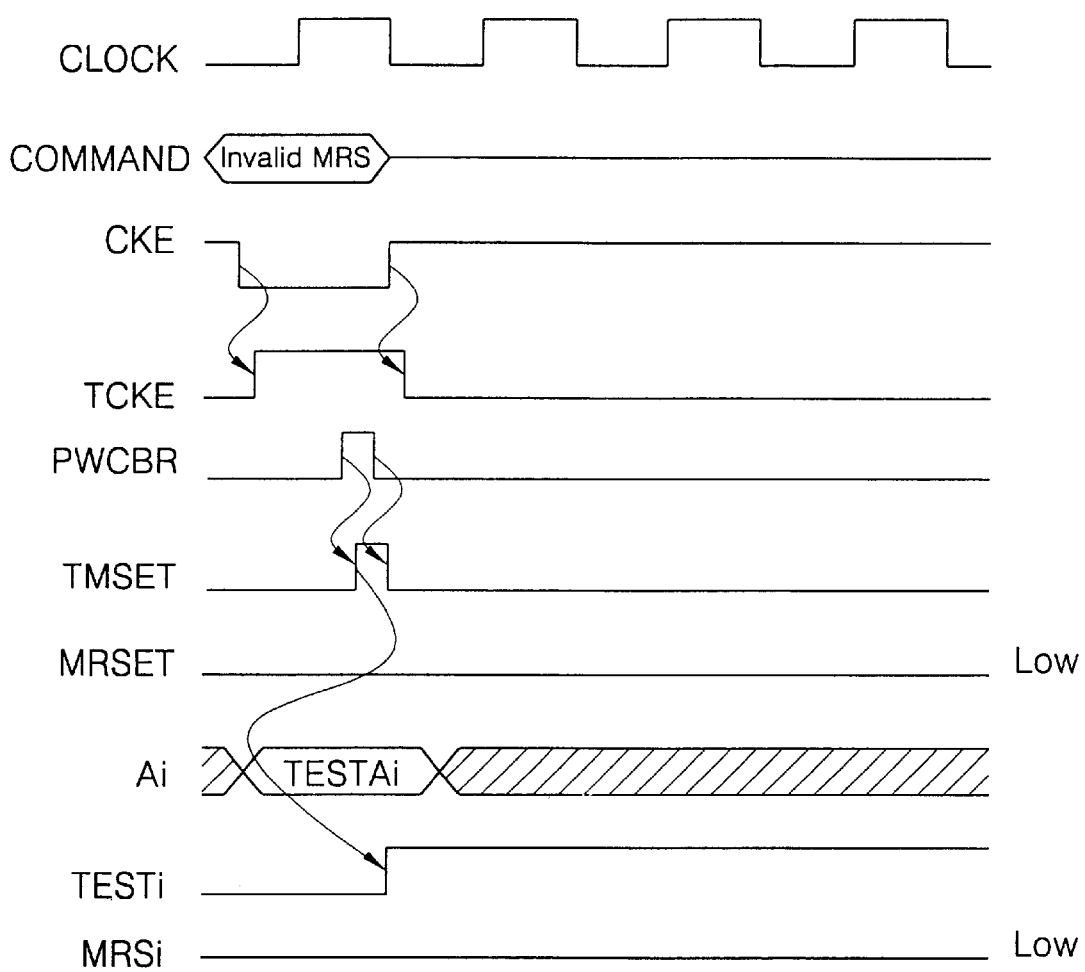
FIG. 9 is a timing diagram for explaining an operation of the circuit shown in FIG. 4 in a test mode.

FIG. 8 is a timing diagram for explaining an operation of the circuit shown in FIG. 4 in a user mode, and FIG. 9 is a timing diagram for explaining an operation of the circuit shown in FIG. 4 in a test mode.

First, a SDRAM programs CAS latency, burst type, burst length and various operation modes in a user mode. However, an operation mode is set by performing a MRS operation at power up, because a default value is not designated.

When the clock enable signal CKE is at a high level in an active mode, the signal TCKE is kept at a low level. Then, if an external chip select signal /CS, an external row address strobe signal /RAS, an external column address strobe signal /CAS and an external write enable signal /WE are all at a low level, external address signals are written to the mode register 20. And, a PWCBR pulse signal that is a MRS write signal is automatically generated.

However, in case an address signal written into the mode register 20 is matched to a test mode when an invalid MRS command is generated, the mode control signal generator 24 generates a test mode control signal. However, in the present invention, the NAND gate G4 of the second signal generator 248 blocks the combination of detecting signals, because the internal control signal TCKE generated by the internal control signal generator 22 is kept at a low level. Therefore, the test mode control signal TMSET is kept at a low level in an invalid MRS operation. Therefore, the transfer gate TG2 of the second output unit 28 can not be turned on, and thus an invalid MRS signal is not transferred to the second decoder 32.

Next, if a valid MRS operation is started, the mode control signal generator 24 generates a MRS control signal that is, a MRSET pulse signal by writing associated address signals with a MRS. The inputted MRS address signals are provided to the first decoder 30 through the first output unit 26, and decoded by the first decoder 30. Responding to MRSi signals corresponding to the result of decoding, a SDRAM is set with a given operation mode.

In a test mode, if an invalid MRS that is, a test mode write command is input, a clock enable signal CKE is kept at a low level, and thus the internal control signal TCKE is maintained at a high level. In this case, the mode control signal generator 24 generates a test mode control signal TMSET, because a PWCBR pulse is generated as automatic pulse when the command is given. That is, the test mode control signal is not blocked by the internal control signal TCKE, but generated normally. Therefore, a test mode address signal is transferred to the second decoder 32, and decoded by the second decoder 32. Responding to a TESTi signal corresponding to the result of decoding, a SDRAM is set with a given test operation mode.

As described above, the present invention can completely block a test mode set of an inefficient MRS operation, by using a clock enable signal in a user mode. Therefore, the present invention is very convenient for a user to use in connection with a conventional valid MRS method, in which a user should wait until an inefficient test operation is completed and then repaired to a normal state.

Although the present invention has been described and illustrated in detail, it is clearly understood that the same is by way of illustration and example only and is not to be taken by way of limitation, the spirit and scope of the present invention being limited only by the terms of the appended claims. For example, if the memory operates with a different number of bits, the person skilled in the art will be able to make the appropriate adjustments.

What is claimed is:

1. An operation mode setting circuit of a semiconductor memory device, comprising:
   a mode register for providing internal address signals in response to externally input address signals;
   a mode control signal generator for generating one of a test mode control signal and a mode register set control signal by combining, the internal address signals, the mode control signal generator generating the test mode control signal in response to a mode register set write signal and also to an additional internal control signal, the internal control signal for controlling generation of the test mode signal; and
   an output unit for outputting a corresponding address signal among the internal address signals as a first internal address signal in response to the mode register set control signal and for outputting a corresponding address signal among the internal address signals as a second internal address signal in response to the test mode control signal.

2. The circuit of claim 1, further comprising:
   an internal control signal generator for receiving an external control signal and for generating the internal control signal in response to the external control signal.

3. The circuit of claim 2, wherein the internal control signal generator includes:
   a comparator for detecting an active state of the external control signal; and
   an output buffer for buffering an output signal of the comparator, to output it as the internal control signal.

4. The circuit of claim 2, wherein the mode control signal generator comprises:
   a first detector for detecting non-active data of a test mode among the internal address signals;
   a second detector for detecting non-active data of a mode register set mode among the internal address signals;
   a first signal generator for outputting the mode register set control signal obtained by combining output signals of the first and second detector in response to the mode register set write signal; and
   a second signal generator for outputting a test mode control signal obtained by combining output signals of the first and second detector in response to the mode register set write signal and the external control signal.

5. The circuit of claim 4, wherein
   the non-active data of the second detector is detected when address signals determining a column address strobe latency are all at a high level, and
   the non-active data of the first detector is detected when address signals determining a test mode are all at a high level.

6. A method for setting an operation mode of a semiconductor memory device comprising:
   generating internal address signals by inputting external address signals into a mode register;

receiving an external control signal in an internal control signal generator to generate an internal control signal in response thereof;

generating one of a test mode control signal and mode register set control signal depending on the internal address signals in response to a mode register set write signal and to the internal control signal; and outputting a corresponding address signal among the internal address signals as a first internal address signal in response to the mode register set control signal if a mode register set control signal has been generated, and outputting a corresponding address signal among the internal address signals as a second internal address signal in response to the test mode control signal if a test mode control signal has been generated.

7. The method of claim 6, wherein the mode control signals are generated by:

outputting a first and second detecting signals by detecting non-active data of a mode register set and a test mode among the internal address signals; and outputting the mode register set control signal and test mode control signal obtained by combining the first and second detecting signals in response to the mode register set write signal, wherein the test mode control signal is output in response to the internal control signal.

8. The method of claim 7, wherein the non-active data of the mode register set mode is detected when address signals determining a column address strobe latency are all at a high level, and the non-active data of the test mode is detected when address signals determining a test mode are all at a high level.

9. An operation mode setting circuit of a semiconductor memory device, comprising:

a mode register for providing internal address signals in response to externally input address signals;

an internal control signal generator for receiving an external control signal and for generating an internal control signal in response to the external control signal;

a mode control signal generator for generating one of a test mode control signal and a mode register set control signal by combining the internal address signals, the mode control signal generator generating the test mode control signal in response to a mode register set write signal, and also in response to the internal control signal; and an output unit for outputting a corresponding address signal among the internal address signals as a first internal address signal in response to the mode register set control signal and for outputting a corresponding address signal among the internal address signals as a second internal address signal in response to the test mode control signal.

10. The circuit of claim 9, wherein the internal control signal generator includes:

a comparator for detecting an active state of the external control signal; and an output buffer for buffering an output signal of the comparator, to output it as the internal control signal.

11. The circuit of claim 9, wherein the mode control signal generator comprises:

a first detector for detecting non-active data of a test mode among the internal address signals;

a second detector for detecting non-active data of a mode register set mode among the internal address signals;

a first signal generator for outputting the mode register set control signal obtained by combining output signals of the first and second detector in response to the mode register set write signal; and a second signal generator for outputting a test mode control signal obtained by combining output signals of the first and second detector in response to the mode register set write signal and the external control signal.

12. The circuit of claim 11, wherein the non-active data of the second detector is detected when address signals determining a column address strobe latency are all at a high level, and the non-active data of the first detector is detected when address signals determining a test mode are all at a high level.

* * * * *